(12) United States Patent
Tanaka

(10) Patent No.: US 9,153,537 B2
(45) Date of Patent: Oct. 6, 2015

(54) SEMICONDUCTOR DEVICE AND MANUFACTURING METHOD THEREOF

(71) Applicant: Semiconductor Energy Laboratory Co., Ltd., Kanagawa-ken (JP)

(72) Inventor: Tetsuhiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/941,869

(22) Filed: Jul. 15, 2013

(65) Prior Publication Data

US 2013/0299991 A1    Nov. 14, 2013

Related U.S. Application Data

(62) Division of application No. 13/172,416, filed on Jun. 29, 2011, now Pat. No. 8,486,773.

(30) Foreign Application Priority Data

Jul. 2, 2010    (JP) ................. 2010-151890

(51) Int. Cl.
| | |
|---|---|
| *H01L 23/48* | (2006.01) |
| *H01L 23/52* | (2006.01) |
| *H01L 29/40* | (2006.01) |
| *H01L 23/532* | (2006.01) |
| *H01L 29/04* | (2006.01) |
| *H01L 29/45* | (2006.01) |

(Continued)

(52) U.S. Cl.
CPC .......... *H01L 23/53238* (2013.01); *H01L 29/04* (2013.01); *H01L 29/458* (2013.01); *H01L 29/66765* (2013.01); *H01L 29/78672* (2013.01); *H01L 29/78696* (2013.01); *H01L 2924/0002* (2013.01)

(58) Field of Classification Search
CPC .................... H01L 2/532383; H01L 23/53238
USPC .......... 257/751, E21.592; 438/158, 653, 627, 438/643
See application file for complete search history.

(56) References Cited

U.S. PATENT DOCUMENTS

| | | |
|---|---|---|
| 6,090,701 A | 7/2000 | Hasunuma et al. |
| 6,153,893 A | 11/2000 | Inoue et al. |
| 6,306,756 B1 | 10/2001 | Hasunuma et al. |

(Continued)

FOREIGN PATENT DOCUMENTS

| | | |
|---|---|---|
| EP | 0 535 979 A2 | 4/1993 |
| JP | 03-268425 A | 11/1991 |

(Continued)

*Primary Examiner* — Jarrett Stark
(74) *Attorney, Agent, or Firm* — Husch Blackwell LLP

(57) ABSTRACT

A semiconductor film having an impurity region to which at least an n-type or p-type impurity is added and a wiring are provided. The wiring includes a diffusion prevention film containing a conductive metal oxide, and a low resistance conductive film over the diffusion prevention film. In a contact portion between the wiring and the semiconductor film, the diffusion prevention film and the impurity region are in contact with each other. The diffusion prevention film is framed in such a manner that a conductive film is exposed to plasma generated from a mixed gas of an oxidizing gas and a halogen-based gas to form an oxide of a metal material contained in the conductive film, the conductive film in which the oxide of the metal material is formed is exposed to an atmosphere containing water to be fluidized, and the fluidized conductive film is solidified.

19 Claims, 12 Drawing Sheets

(51) Int. Cl.
*H01L 29/66* (2006.01)
*H01L 29/786* (2006.01)

(56) References Cited

U.S. PATENT DOCUMENTS

| | | | |
|---|---|---|---|
| 6,350,995 | B1 | 2/2002 | Sung et al. |
| 6,432,755 | B2 | 8/2002 | Sung |
| 6,468,839 | B2 | 10/2002 | Inoue et al. |
| 6,846,739 | B1 | 1/2005 | Cathey et al. |
| 6,891,270 | B2 | 5/2005 | Sugawara et al. |
| 7,371,680 | B2 | 5/2008 | Tanaka |
| 7,384,862 | B2 | 6/2008 | Yamazaki |
| 7,551,655 | B2 | 6/2009 | Tanaka et al. |
| 7,842,528 | B2 | 11/2010 | Fujikawa et al. |
| 2005/0012097 | A1 | 1/2005 | Yamazaki |
| 2008/0284709 | A1 | 11/2008 | Yamazaki |
| 2009/0033818 | A1 | 2/2009 | Nakajima et al. |
| 2009/0057683 | A1 | 3/2009 | Nakajima et al. |
| 2009/0061574 | A1 | 3/2009 | Nakajima et al. |
| 2009/0267087 | A1 | 10/2009 | Yang et al. |
| 2011/0065221 | A1 | 3/2011 | Fujikawa et al. |
| 2012/0001335 | A1 | 1/2012 | Tanaka et al. |

FOREIGN PATENT DOCUMENTS

| | | |
|---|---|---|
| JP | 5-129608 | 5/1993 |
| JP | 06-291318 A | 10/1994 |
| JP | 7-130851 | 5/1995 |
| JP | 7-131030 | 5/1995 |
| JP | 8-316233 | 11/1996 |
| JP | 09-090406 A | 4/1997 |
| JP | 2001-53283 | 2/2001 |
| JP | 2001-068679 A | 3/2001 |
| JP | 2001-102383 | 4/2001 |
| JP | 2005-49832 | 2/2005 |
| JP | 2005-191546 | 7/2005 |
| JP | 2006-066642 A | 3/2006 |

101  103 105  107 138    140     111

115  139  141   117

SEMICONDUCTOR DEVICE AND MANUFACTURING METHOD THEREOF

This application is a divisional of copending U.S. application Ser. No. 13/172,416 Jun. 29, 2011 which is incorporated herein by reference.

BACKGROUND OF THE INVENTION

1. Field of the Invention

The present invention relates to a semiconductor device and a method for manufacturing the semiconductor device.

In this specification, a semiconductor device means all types of devices which can function by utilizing semiconductor characteristics, and a display device, an electro-optical device, a photoelectric conversion device, a semiconductor circuit, and an electronic appliance are all semiconductor devices.

2. Description of the Related Art

As one type of field-effect transistor, a thin film transistor whose channel region is formed using a semiconductor film that is formed over a substrate having an insulating surface is known. Techniques in which an amorphous silicon film, a microcrystalline silicon film, or a polycrystalline silicon film is used for a semiconductor film used for a channel region of a thin film transistor have been disclosed (see Patent Documents 1 to 5). A typical application of thin film transistors is a liquid crystal television device, in which thin film transistors are put to practical use as a switching transistor for each pixel that constitutes a display screen.

REFERENCE

Patent Document

[Patent Document 1] Japanese Published Patent Application No. 2001-053283
[Patent Document 2] Japanese Published Patent Application No. H05-129608
[Patent Document 3] Japanese Published Patent Application No. 2005-049832
[Patent Document 4] Japanese Published Patent Application No. H07-131030
[Patent Document 5] Japanese Published Patent Application No. 2005-191546

SUMMARY OF THE INVENTION

A glass substrate for manufacturing display panels has grown in size from year to year as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm). From now on, the size of the glass substrate is expected to grow to the 9th generation (2400 mm×2800 mm), and the 10th generation (2950 mm×3400 mm). The increase in size of glass substrate is based on the concept of minimum cost design.

In the case where a thin film transistor is formed over a large-area mother glass substrate, copper or aluminum which is a wiring material with low resistance is used as a material for a wiring to avoid wiring delay. In this case, because diffusion of the wiring material with low resistance into a semiconductor film causes a problem, a diffusion prevention film needs to be formed between the semiconductor film and the wiring material with low resistance. Note that as the semiconductor film, an amorphous silicon film, a microcrystalline silicon film, a polycrystalline silicon film, a single crystal silicon film, an amorphous germanium film, a microcrystalline germanium film, a polycrystalline germanium film, a single crystal germanium film, or a film of mixture thereof is used.

In the case where a wiring is formed over a semiconductor film having an uneven surface, a portion having small thickness or a portion where a film is not formed might be generated in a shade due to a depression or a projection. For example, in the case where the semiconductor film is a microcrystalline silicon film or a polycrystalline silicon film, it is preferable that the grain size of a crystal be large to increase the field-effect mobility; however, surface roughness might be increased due to a large grain size of a crystal. As a result, a diffusion prevention film might have a portion having extremely small thickness or a portion where the film is not formed over a portion of the semiconductor film where the surface is particularly rough. Further, the diffusion prevention film might have a portion having extremely small thickness or a portion where the film is not formed at a step generated at the time when the semiconductor film is processed into an island shape. Generation of a portion having extremely small thickness and a portion where a film is not formed in the diffusion prevention film causes diffusion of a wiring material with low resistance into the semiconductor film, leading to an increase in off-state current of a thin film transistor.

An object of one embodiment of the present invention is to provide a method for manufacturing a semiconductor device having favorable electric characteristics with a high yield.

A feature of one embodiment of the present invention is to provide a wiring including a diffusion prevention film and a low resistance conductive film over a semiconductor film having an uneven surface or at a step portion in which the semiconductor film forms. The diffusion prevention film includes at least a conductive metal oxide film.

A semiconductor device according to one embodiment of the present invention includes a semiconductor film which includes an impurity region to which at least an n-type or p-type impurity is added; and a wiring. The wiring includes a diffusion prevention film containing a conductive metal oxide; and a low resistance conductive film over the diffusion prevention film. In a contact portion between the wiring and the semiconductor film, the diffusion prevention film and the impurity region are in contact with each other.

A metal element included in the diffusion prevention film is one or more of titanium, nickel, zinc, gallium, zirconium, niobium, molybdenum, indium, tin, and tungsten.

The low resistance conductive film is any one of an aluminum film, a copper film, a silver film, an alloy film containing aluminum as its main component, an alloy film containing copper as its main component, and an alloy film containing silver as its main component.

Note that a conductive film may be provided between the semiconductor film and the conductive metal oxide film. A metal element included in the conductive film is one or more of titanium, nickel, zinc, gallium, zirconium, niobium, molybdenum, indium, tin, and tungsten.

A method for manufacturing a semiconductor device, according to one embodiment of the present invention, includes the steps of forming a semiconductor film which includes at least an n-type or p-type impurity region; and forming a wiring over the semiconductor film, part of which is in contact with the semiconductor film. The wiring includes a diffusion prevention film containing a conductive metal oxide; and a low resistance conductive film over the diffusion prevention film. In a contact portion between the wiring and the semiconductor film, the diffusion prevention film and the impurity region are in contact with each other.

The diffusion prevention film may be formed in such a manner that a conductive film is exposed to plasma generated from a mixed gas of an oxidizing gas and a halogen-based gas to form an oxide of a metal material contained in the conductive film, the conductive film in which the oxide of the metal material is formed is exposed to an atmosphere containing water to be fluidized, and the fluidized conductive film is solidified.

A metal element included in the conductive film is one or more of titanium, nickel, zinc, gallium, zirconium, niobium, molybdenum, indium, tin, and tungsten.

In one embodiment of the present invention, the oxidizing gas contains at least any one of oxygen, water, ozone, and nitrous oxide.

For example, when an insulating film which is in contact with the conductive film contains oxygen or water, oxygen or water contained in the insulating film can be supplied to the conductive film as an oxidizing gas. Alternatively, an oxidizing gas remaining in a chamber where plasma is generated may be used for oxidation of the conductive film.

In one embodiment of the present invention, the halogen-based gas refers to a gas containing halogen. Typical examples are gas containing at least any one of carbon tetrafluoride, sulfur fluoride, nitrogen fluoride, trifluoromethane, octafluorocyclobutane, chlorine, boron trichloride, silicon chloride, and carbon tetrachloride. A carbon tetrafluoride gas is preferably used.

In one embodiment of the present invention, the conductive film is fluidized and solidified (also referred to as reflowed), so that the diffusion prevention film can be uniformly formed over a portion having extremely small thickness or a portion where the diffusion prevention film is not formed.

In one embodiment of the present invention, the oxide included in the conductive film may contain fluorine at a concentration of $1\times10^{19}$ atoms/cm$^3$ or higher.

By application of one embodiment of the present invention, a diffusion prevention film can be uniformly formed even over a semiconductor film having an uneven surface and at a step portion in which the semiconductor film forms. Accordingly, a wiring material with low resistance can be prevented from diffusing into the semiconductor film, and thus, a semiconductor device having favorable electric characteristics can be manufactured with a high yield.

DETAILED DESCRIPTION OF THE INVENTION

Figure 1A:
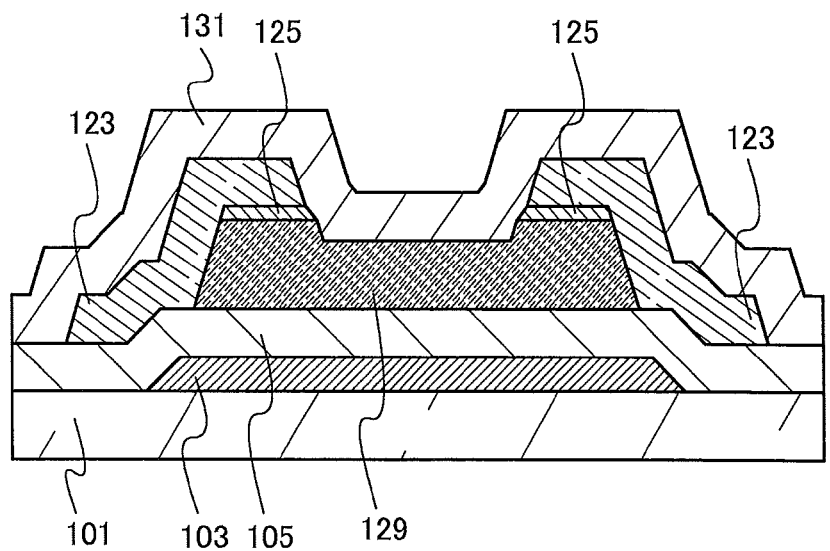
FIGS. 1A and 1B are cross-sectional views illustrating a semiconductor device of one embodiment of the present invention.

Hereinafter, embodiments and an example of the present invention will be described in detail with reference to the accompanying drawings. However, the present invention is not limited to the description below and it is easily understood by those skilled in the art that modes and details can be changed variously. Therefore, the present invention is not construed as being limited to description of the embodiments and the example. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

(Embodiment 1)

In this embodiment, a cross-sectional structure of a thin film transistor which can be used for a semiconductor device according to one embodiment of the present invention will be described with reference to FIGS. 1A and 1B. Note that an n-channel thin film transistor has higher carrier mobility than a p-channel thin film transistor. Further, it is preferable that all thin film transistors formed over the same substrate have the same polarity because the number of manufacturing steps can be reduced. Therefore, in this embodiment, an n-channel thin film transistor will be described. Needless to say, a p-channel thin film transistor can be used as appropriate.

A thin film transistor illustrated in FIG. 1A includes, over a substrate 101, a gate electrode 103, a semiconductor film 129, a gate insulating film 105 provided between the gate electrode 103 and the semiconductor film 129, impurity semiconductor films 125 serving as a source region and a drain region over the semiconductor film 129, and wirings 123 in contact with the impurity semiconductor films 125. An insulating film 131 may be formed over the semiconductor film 129 and the wirings 123.

The wirings 123 include a diffusion prevention film and a low resistance conductive film The diffusion prevention film is provided between the semiconductor film and the low resistance conductive film. Thus, diffusion of a material of the low resistance conductive film into the semiconductor film can be suppressed.

Next, components of the thin film transistor are described below.

As the substrate 101, a glass substrate, a ceramic substrate, a plastic substrate which has high heat resistance enough to withstand a process temperature of this manufacturing process, or the like can be used. In the case where the substrate does not need a light-transmitting property, a metal substrate, such as a stainless steel alloy substrate, provided with an insulating film on its surface may be used. As a glass substrate, an alkali-free glass substrate formed using barium borosilicate glass, aluminoborosilicate glass, aluminosilicate glass, or the like may be used. Note that there is no limitation on the size of the substrate 101. For example, any of glass substrates of the 3rd to 10th generations which are often used in the field of the above flat panel display can be used.

The gate electrode 103 can be formed as a single layer or a stacked layer using a metal film such as a molybdenum film, a titanium film, a chromium film, a tantalum film, a tungsten film, an aluminum film, a copper film, a neodymium film, a scandium film, or a nickel film or an alloy film which contains any of these materials as its main component. Alternatively, a semiconductor typified by polycrystalline silicon doped with an impurity element such as phosphorus, a silver-palladium-copper alloy, an aluminum-neodymium alloy, an aluminum-nickel alloy, or the like may be used.

For example, a two-layer structure in which a titanium nitride film and a molybdenum film are stacked can be used as a two-layer structure of the gate electrode 103. Alternatively, the following structure is preferable as a two-layer structure of the gate electrode 103: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; a two-layer structure in which a copper-manganese alloy film and a copper film are stacked; and the like. As a three-layer structure, it is preferable to stack a tungsten film or a tungsten nitride film, an aluminum-silicon alloy film or an aluminum-titanium alloy film, and a titanium nitride film or a titanium film. When the gate electrode 103 has a structure in which a metal film serving as a diffusion prevention film is stacked over a low resistance conductive film containing aluminum, copper, or the like, electric resistance can be made low and a material of the low resistance conductive film can be prevented from diffusing into the silicon film.

The gate insulating film 105 can be formed as a single layer or a stacked layer using one or more of a silicon oxide film, a silicon nitride film, a silicon oxynitride film, a silicon nitride oxide film, an aluminum oxide film, an aluminum nitride film, an aluminum nitride oxide film, a hafnium oxide film, and a hafnium oxide nitride film by a CVD method, a sputtering method, or the like. When the gate insulating film 105 is formed using a silicon oxide film or a silicon oxynitride film, fluctuation in the threshold voltage of the thin film transistor can be preferably suppressed.

Note that here, silicon oxynitride means silicon that includes more oxygen than nitrogen. In the case where measurements are performed using Rutherford backscattering spectrometry (RBS) and hydrogen forward scattering spectrometry (HFS), silicon oxynitride includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen. In the case where measurements are performed using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The semiconductor film 129 can be formed using an amorphous silicon film, a microcrystalline silicon film, a polycrystalline silicon film, a single crystal silicon film, an amorphous germanium film, a microcrystalline germanium film, a polycrystalline germanium film, a single crystal germanium film, or a film of a mixture thereof by a CVD method, a sputtering method, or the like.

In the case where any of the aforementioned crystalline materials is used for the semiconductor film 129, the field-effect mobility of a thin film transistor to be manufactured tends to be increased as a grain size of a crystal is larger. However, surface roughness of the semiconductor film is also increased. Since a depression or a projection on a surface of the semiconductor film forms a shade, a portion having extremely small thickness or a portion where a film is not formed might be generated in a film to be formed later than the semiconductor film.

The impurity semiconductor films 125 are formed using an amorphous silicon film to which phosphorus is added, a microcrystalline silicon film to which phosphorus is added, an amorphous germanium film to which phosphorus is added, a microcrystalline germanium film to which phosphorus is added, or the like. Further, a stacked structure including the above films can be used. Note that in the case where a p-channel thin film transistor is formed as a thin film transistor, the impurity semiconductor films 125 are formed using a microcrystalline silicon film to which boron is added, an amorphous silicon film to which boron is added, an amorphous germanium film to which boron is added, a microcrystalline germanium film to which boron is added, or the like. Note that in the case where ohmic contacts are formed between the semiconductor film 129 and the wirings 123 to be formed later, the impurity semiconductor films 125 are not necessarily formed.

Figure 1B:
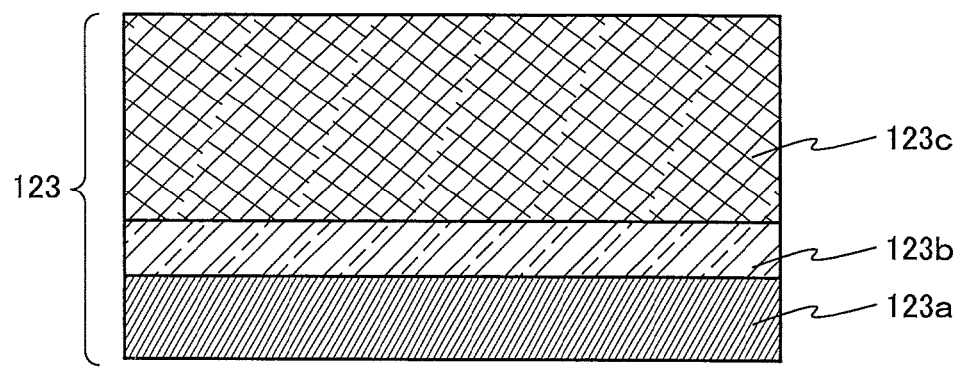

The wirings 123 are each a stack of a diffusion prevention film and a low resistance conductive film (see FIG. 1B). Here, at least either a conductive film 123*a* or a metal oxide film 123*b* is a diffusion prevention film. Conductive films may be additionally provided between the metal oxide film 123*b* and a low resistance conductive film 123*c* and over the low resistance conductive film 123*c*. A constituent element of the conductive film is one or more of titanium, nickel, zinc, gallium, zirconium, niobium, molybdenum, indium, tin, and tungsten. When the diffusion prevention film is formed between the semiconductor film 129 and the low resistance conductive film 123*c*, diffusion of a material of the low resistance conductive film 123*c* into the semiconductor film 129 can be suppressed.

For example, the wirings 123 can include a titanium film as the conductive film 123*a*, a titanium oxide film as the metal oxide film 123*b* over the conductive film 123*a*, and an aluminum film as the low resistance conductive film 123*c* over the metal oxide film 123*b*. Needless to say, the structure of the wirings 123 is not limited to the above. For example, a stacked structure of less than three layers, or a stacked structure of four or more layers may be employed.

Here, in the metal oxide film 123*b* which is the titanium oxide film, the number of oxygen atoms is less than twice the number of titanium atoms. The titanium oxide film can serve as part of the wiring when oxygen deficiency is caused and the titanium oxide film obtains conductivity. Further, the metal oxide film 123b which is the titanium oxide film contains fluorine or chlorine at a concentration of $1\times10^{19}$ atoms/cm$^3$ or higher.

In this embodiment, after the titanium film is formed, surface treatment is performed using plasma generated from a mixed gas of an oxidizing gas and a halogen-based gas to oxidize, and fluorinate or chlorinate part of or the whole of a surface of the titanium film. Then, the conductive film 123a is exposed to an atmosphere containing water to be fluidized, part of fluorine or chlorine is removed from the fluidized film, and the fluidized film is solidified. Thus, the conductive film 123a which is a titanium film and the metal oxide film 123b which is a titanium oxide film are formed.

A dry etching apparatus, a CVD apparatus, or the like can be used for generating plasma. As a method for generating plasma, a reactive ion etching (RIE) method, an inductively coupled plasma (ICP) method, an electron cyclotron resonance (ECR) method, or the like can be used.

Note that in the case where the gate insulating film 105 contains oxygen or water, an oxidizing gas can be supplied from the gate insulating film 105. Alternatively, an oxidizing gas remaining in a chamber where plasma is generated may be used.

In this embodiment, by reflow of the conductive film, in the conductive film 123a, a portion having extremely small thickness or a portion where the conductive film 123a is not formed can be covered with the metal oxide film 123b, whereby a uniform diffusion prevention film can be formed.

In this embodiment, a diffusion prevention film can also be formed uniformly over a depression or a projection on a surface of the semiconductor film 129 or a step formed by the semiconductor film 129. Accordingly, a material of the low resistance conductive film 123c can be prevented from diffusing into the semiconductor film 129.

The insulating film 131 serves as a protective film for preventing contaminants from entering the semiconductor film 129 from the outside. The insulating film 131 may be formed using a material similar to that of the gate insulating film 105.

Note that a dual-gate thin film transistor may be employed in which a back gate electrode overlapping with the semiconductor film 129 with the insulating film 131 interposed therebetween is provided.

With the use of the thin film transistor described in this embodiment for switching of a pixel in a display device, the display device achieves high contrast and high image quality. Further, in electric charge stored in a storage capacitor, the amount of electric charge discharged due to off-state current of the thin film transistor can be reduced. Accordingly, storage capacitance can be reduced and an area of a storage capacitor can be reduced. Furthermore, when storage capacitance is reduced, current capability needed for storing electric charge can be reduced. Therefore, the areas of the thin film transistor can be reduced. The area of the storage capacitor and the area of the thin film transistor are reduced, whereby the aperture ratio of a pixel is increased and the transmittance of a backlight is improved. Consequently, the amount of light from the backlight can be reduced. Further, low power consumption can be realized. By the reduction in the size of the storage capacitor in each pixel, a load on a driver circuit is reduced. Therefore, the size of the thin film transistor in the driver circuit portion can be reduced, and the frame of the display device can be narrowed. Furthermore, by the reduction in the load on the driver circuit and improvement in the aperture ratio of the pixel, the definition of the display device can be increased. Therefore, a high-definition large display in which the number of pixels is 2 k×4 k or 4 k×8 k can be manufactured. Moreover, by the reduction in the load on the driver circuit and the increase in a grain size of a crystal of a microcrystalline semiconductor film, high-speed drive can be performed, and a high-definition large display can operate at high speed or a high-definition large three-dimensional display can be manufactured.

(Embodiment 2)

In this embodiment, a thin film transistor having a structure (top gate structure) different from that described in Embodiment 1 will be described.

The thin film transistor includes, over a substrate, a semiconductor film, impurity semiconductor films serving as a source region and a drain region over the semiconductor film, wirings in contact with the impurity semiconductor films, and a gate electrode provided over the semiconductor film with a gate insulating film interposed therebetween. An insulating film may be formed below the semiconductor film.

The wirings which are partly in contact with the semiconductor film each include a diffusion prevention film between a low resistance conductive film and the semiconductor film; therefore, diffusion of a material of the low resistance conductive film into the semiconductor film can be suppressed. Accordingly, off-state current of the thin film transistor can be suppressed low.

(Embodiment 3)

In this embodiment, a thin film transistor having a structure different from those described in Embodiment 1 and Embodiment 2 is described with reference to FIGS. 2A and 2B.

Figure 2A:
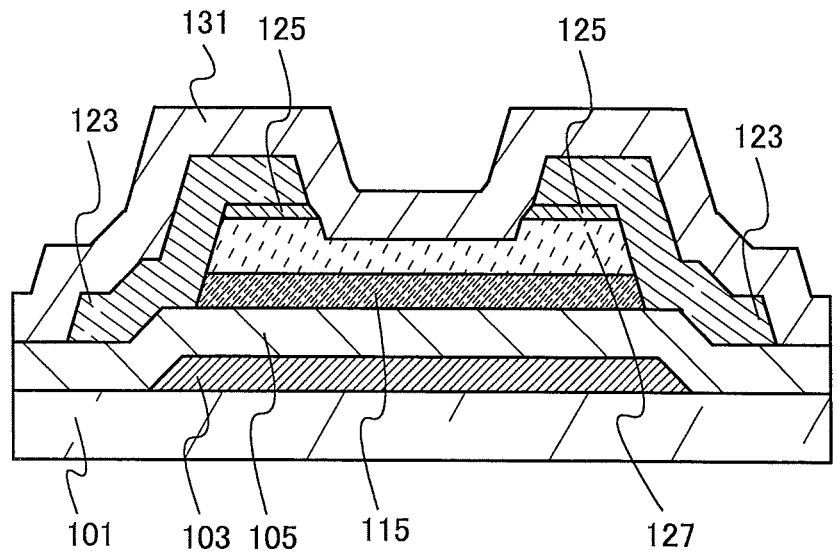
FIGS. 2A and 2B are cross-sectional views each illustrating a semiconductor device of one embodiment of the present invention.

A thin film transistor illustrated in FIG. 2A includes, over the substrate 101, the gate electrode 103, a semiconductor film 115, the gate insulating film 105 provided between the gate electrode 103 and the semiconductor film 115, an amorphous semiconductor film 127 over the semiconductor film 115, the impurity semiconductor films 125 serving as a source region and a drain region in contact with the amorphous semiconductor film 127, and the wirings 123 which are in contact with the impurity semiconductor films 125 in contact portions. The insulating film 131 may be formed over the amorphous semiconductor film 127 and the wirings 123.

Figure 2B:
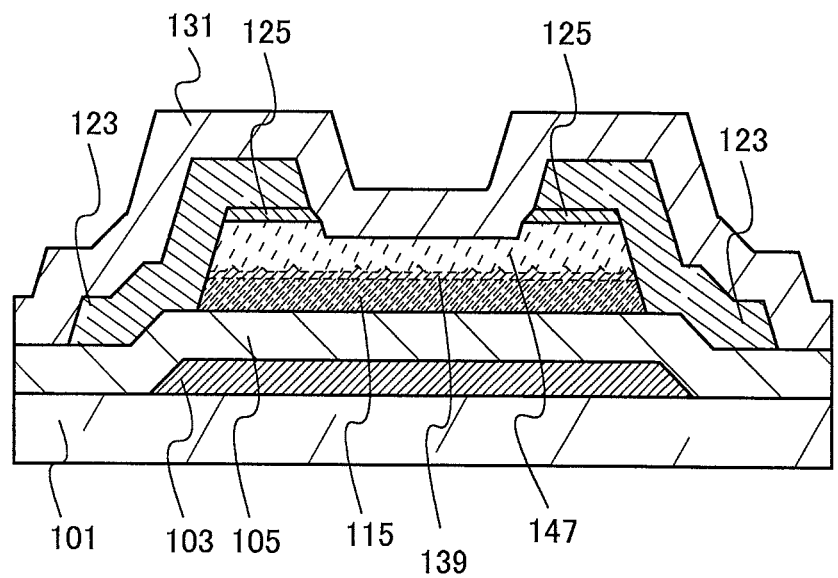

A thin film transistor illustrated in FIG. 2B includes, over the substrate 101, the gate electrode 103, the semiconductor film 115, the gate insulating film 105 provided between the gate electrode 103 and the semiconductor film 115, a microcrystalline semiconductor film 139 containing nitrogen, which is in contact with the semiconductor film 115, an amorphous semiconductor film 147 containing nitrogen, which is in contact with the microcrystalline semiconductor film 139 containing nitrogen, the impurity semiconductor films 125 serving as a source region and a drain region, which are in contact with the amorphous semiconductor film 147 containing nitrogen, and the wirings 123 which are in contact with the impurity semiconductor films 125. The insulating film 131 may be formed over the amorphous semiconductor film 147 containing nitrogen and the wirings 123. The wiring 123 includes a diffusion prevention film and a low resistance conductive film. The diffusion prevention film is provided between the semiconductor film and the low resistance conductive film. Therefore, diffusion of the material of the low resistance conductive film into the semiconductor film can be suppressed. As for the wiring 123, Embodiment 1 can be applied.

Figure 7A:
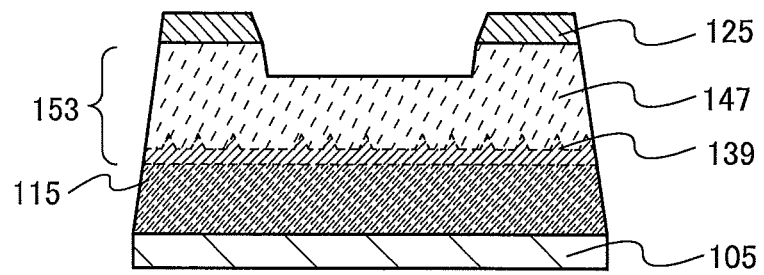
FIGS. 7A and 7B are cross-sectional views each illustrating a method for manufacturing a semiconductor device of one embodiment of the present invention.
Figure 7B:
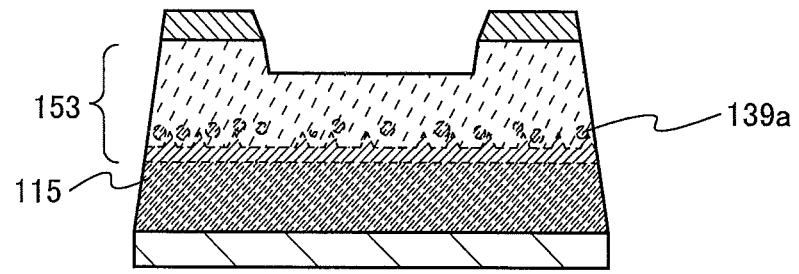

The details of the microcrystalline semiconductor film 139 containing nitrogen and the amorphous semiconductor film 147 containing nitrogen will be described with reference to FIGS. 7A and 7B. FIGS. 7A and 7B are each an enlarged view between the gate insulating film 105 and the impurity semiconductor films 125.

As shown in FIG. 7A, the microcrystalline semiconductor film 139 containing nitrogen in a semiconductor film 153 containing nitrogen has projections or depressions; the microcrystalline semiconductor film 139 containing nitrogen has a projecting (conical or pyramidal) shape whose tip is narrowed from the gate insulating film 105 side toward the amorphous semiconductor film 147 containing nitrogen (the tip of the projection has an acute angle). Note that the microcrystalline semiconductor film 139 containing nitrogen may have a projecting (inverted conical or pyramidal) shape whose width increases from the gate insulating film 105 side toward the amorphous semiconductor film 147 containing nitrogen.

The thickness of the microcrystalline semiconductor film 139 containing nitrogen, that is, the distance from an interface between the microcrystalline semiconductor film 139 containing nitrogen and the gate insulating film 105 to the tip of the projection (projecting portion) of the microcrystalline semiconductor film 139 containing nitrogen is set to be greater than or equal to 5 nm and less than or equal to 310 nm, so that off-state current of the thin film transistor can be reduced.

The concentration of oxygen contained in the semiconductor film 153 containing nitrogen, which is measured by secondary ion mass spectrometry, is set to less than $1 \times 10^{18}$ atoms/cm$^3$, which is preferable since the crystallinity of the microcrystalline semiconductor film 139 containing nitrogen can be increased. The nitrogen concentration profile of the semiconductor film 153 containing nitrogen, which is measured by secondary ion mass spectrometry, has a peak concentration greater than or equal to $1 \times 10^{20}$ atoms/cm$^3$ and less than or equal to $1 \times 10^{21}$ atoms/cm$^3$, preferably greater than or equal to $2 \times 10^{20}$ atoms/cm$^3$ and less than or equal to $1 \times 10^{21}$ atoms/cm$^3$.

The nitrogen contained in the microcrystalline semiconductor film 139 containing nitrogen and the amorphous semiconductor film 147 containing nitrogen may exist, for example, as an NH group or an NH$_2$ group.

The amorphous semiconductor film 147 containing nitrogen is a semiconductor having a less amount of the defect absorption spectrum and lower energy at an Urbach edge, measured by a constant photocurrent method (CPM) or photoluminescence spectroscopy, as compared to a conventional amorphous semiconductor. That is, as compared to the conventional amorphous semiconductor, the amorphous semiconductor containing nitrogen is a well-ordered semiconductor which has few defects and whose tail of a level at a band edge in the valence band is steep. Since the amorphous semiconductor containing nitrogen has a steep tail of a level at a band edge in the valence band, the band gap is wide and tunneling current does not easily flow. Therefore, by providing the amorphous semiconductor film 147 containing nitrogen over the microcrystalline semiconductor film 139 containing nitrogen, off-state current of the thin film transistor can be reduced. In addition, by providing the amorphous semiconductor film 147 containing nitrogen, on-state current and the field-effect mobility can be increased.

As the amorphous semiconductor film 147 containing nitrogen, an amorphous silicon film containing nitrogen can be used, for example. The peak of a spectrum of the amorphous silicon film containing nitrogen that is obtained by low-temperature photoluminescence spectroscopy is greater than or equal to 1.31 eV and less than or equal to 1.39 eV. Note that the peak of a spectrum of microcrystalline silicon that is obtained by low-temperature photoluminescence spectroscopy is greater than or equal to 0.98 eV and less than or equal to 1.02 eV. Accordingly, amorphous silicon containing nitrogen has different characteristics from microcrystalline silicon.

Further, as shown in FIG. 7B, a semiconductor crystal grain 139a whose grain size is greater than or equal to 1 nm and less than or equal to 10 nm, preferably greater than or equal to 1 nm and less than or equal to 5 nm may be included in the amorphous semiconductor film 147 containing nitrogen, so that on-state current and the filed-effect mobility can be further increased.

The microcrystalline semiconductor film 139 having a projecting (conical or pyramidal) shape whose width decreases from the gate insulating film 105 side toward the amorphous semiconductor film 147 containing nitrogen, or the microcrystalline semiconductor film 139 having a projecting shape whose width increases from the gate insulating film 105 side toward the amorphous semiconductor film 147 containing nitrogen has such a structure by being formed in the following manner: after the semiconductor film 115 is formed, crystal growth is performed under such a condition that the crystal growth is reduced, and an amorphous semiconductor film is deposited.

Since the microcrystalline semiconductor film 139 containing nitrogen in the semiconductor film 153 containing nitrogen has the conical or pyramidal shape or the inverted conical or pyramidal shape, resistance in a vertical direction (film thickness direction) when voltage is applied between a source electrode and a drain electrode in an on state, i.e., the resistance of the semiconductor film 153 can be lowered. Further, the amorphous semiconductor containing nitrogen that is a well-ordered amorphous semiconductor which has fewer defects and a steep tail of a level at a band edge in the valence band is provided over the semiconductor film 115; therefore, tunneling current does not easily flow. Thus, in the thin film transistor described in this embodiment, on-state current and the field-effect mobility can be increased while off-state current can be reduced.

Here, the microcrystalline semiconductor film 139 containing nitrogen and the amorphous semiconductor film 147 containing nitrogen are formed using a source gas of the semiconductor film 153 containing nitrogen to which a gas containing nitrogen is added. As another method for forming the semiconductor film 153 containing nitrogen, a surface of the semiconductor film 115 is exposed to a gas containing nitrogen, nitrogen is adsorbed onto the surface of the semiconductor film 115, and the semiconductor film 153 is formed using a deposition gas containing a semiconductor material and hydrogen as source gases; thus, the microcrystalline semiconductor film 139 containing nitrogen and the amorphous semiconductor film 147 containing nitrogen can be formed.

As the deposition gas containing a semiconductor material, a deposition gas containing silicon, typified by SiH$_4$, Si$_2$H$_6$, SiH$_2$Cl$_2$, SiHCl$_3$, SiCl$_4$, and SiF$_4$, a deposition gas containing gennanium, typified by GeH$_4$, Ge$_2$H$_6$, and GeF$_4$, or the like can be given. Alternatively, a mixture of a deposition gas containing silicon and a deposition gas containing germanium may be used.

When the amorphous semiconductor film 147 containing nitrogen or the microcrystalline semiconductor film 139 containing nitrogen is formed between the semiconductor film 115 and the impurity semiconductor films 125, a barrier between the semiconductor film 115 and the impurity semiconductor films 125 can be reduced; accordingly, on-state current and the field-effect mobility of the thin film transistor can be increased.

Crystal growth is suppressed at a later stage of deposition of the microcrystalline semiconductor film by introduction of a gas containing nitrogen into a reaction chamber. As a result, the microcrystalline semiconductor film 139 containing nitrogen and the amorphous semiconductor film 147 containing nitrogen are formed.

According to this embodiment, a diffusion prevention film can be formed uniformly even at a step portion of a semiconductor film; therefore, diffusion of a material of a low resistance conductive film into the semiconductor film can be suppressed. Accordingly, off-state current of the thin film transistor can be suppressed low.

(Embodiment 4)

In this embodiment, a method for manufacturing the thin film transistor described in Embodiment 1 will be described with reference to FIGS. 3A to 3C, FIGS. 4A and 4B, and FIGS. 5A and 5B. In this embodiment, a method for manufacturing the thin film transistor illustrated in FIG. 1A is described; however, this embodiment can also be applied to other thin film transistors described in other embodiments as appropriate.

Figure 3A:
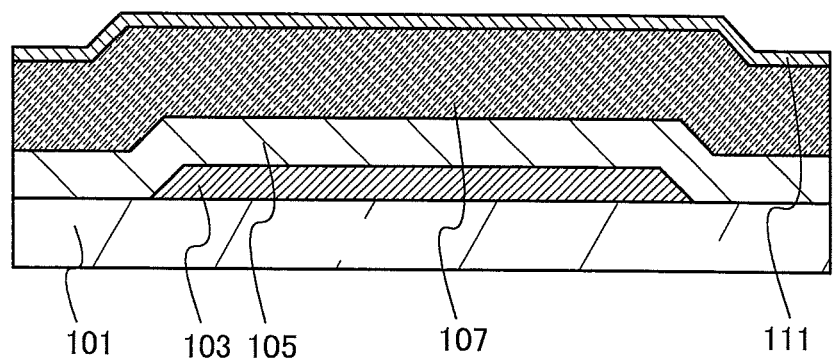
FIGS. 3A to 3C are cross-sectional views illustrating a method for manufacturing a semiconductor device of one embodiment of the present invention.
Figure 3B:
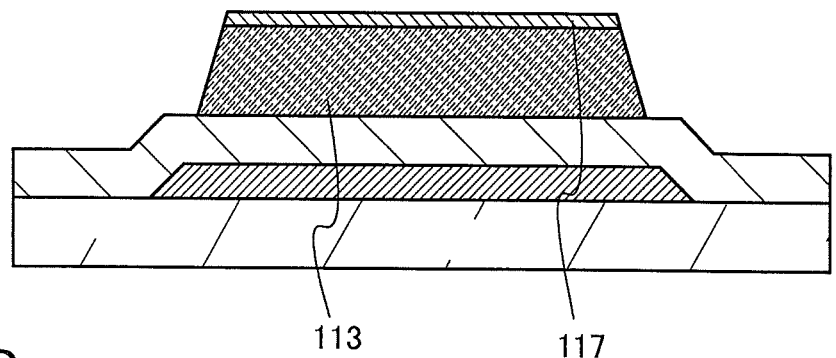

As illustrated in FIG. 3A, the gate electrode 103 is formed over the substrate 101. Next, the gate insulating film 105 which covers the gate electrode 103 is formed, a semiconductor film 107 is formed over the gate insulating film 105, and an impurity semiconductor film 111 is formed over the semiconductor film 107.

As the substrate 101, the substrate 101 described in Embodiment 1 can be used as appropriate.

The gate electrode 103 can be formed in the following manner: a conductive film is formed over the substrate 101 by a sputtering method or a vacuum evaporation method using the materials described in Embodiment 1; a mask is formed over the conductive film by a photolithography method, an inkjet method, or the like; and the conductive film is etched using the mask. Further, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a metal nitride film may be provided between the substrate 101 and the gate electrode 103. Here, a conductive film is formed over the substrate 101 and etched using a resist mask formed by a photolithography method.

Note that side surfaces of the gate electrode 103 are preferably tapered. This is because an insulating film, a silicon film, and a wiring formed over the gate electrode 103 can be prevented from being cut in a step portion of the gate electrode 103 in a later step. In order to taper the side surfaces of the gate electrode 103, etching may be performed while the resist mask is made to recede.

In the step of forming the gate electrode 103, a gate wiring (a scan line) and a capacitor wiring can also be formed at the same time. Note that a scanning line means a wiring which selects a pixel, while a capacitor wiring means a wiring which is connected to one of electrodes of a storage capacitor in a pixel. However, without limitation thereto, the gate electrode 103 and either or both a gate wiring and a capacitor wiring may be formed separately.

The gate insulating film 105 can be formed using the materials described in Embodiment 1.

The gate insulating film 105 can be formed by a CVD method, a sputtering method, or the like. In a step of forming the gate insulating film 105 by a CVD method, glow discharge plasma is generated by applying high-frequency power in the HF band with a frequency of 3 MHz to 30 MHz, typically 13.56 MHz or 27.12 MHz, or high-frequency power in the VHF band with a frequency greater than 30 MHz and less than or equal to about 300 MHz, typically 60 MHz. When the gate insulating film 105 is formed using a microwave plasma CVD apparatus with the frequency of 1 GHz or more, the dielectric strength between the gate electrode and drain and source electrodes can be improved, so that a highly reliable thin film transistor can be obtained. Note that a pulsed oscillation by which high-frequency power is applied in a pulsed manner or a continuous oscillation by which high-frequency power is applied continuously may be applied. In addition, by superimposing high-frequency power in the HF band and high-frequency power in the VHF band on each other, unevenness of plasma in a large-sized substrate is also reduced, so that uniformity can be improved and the deposition rate can be increased.

Further, by forming a silicon oxide film by a CVD method using an organosilane gas as the gate insulating film 105, the crystallinity of the semiconductor film to be formed later can be improved, so that on-state current and the field-effect mobility of the thin film transistor can be increased. As an organosilane gas, a compound containing silicon, such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

In a reaction chamber of the plasma CVD apparatus, the semiconductor film 107 is formed by glow discharge plasma with the use of a mixture of hydrogen and a deposition gas containing a semiconductor material. Alternatively, the semiconductor film 107 may be formed by glow discharge plasma with the use of a mixture of hydrogen, a rare gas such as helium, neon, or krypton, and a deposition gas containing a semiconductor material. Here, a microcrystalline silicon film is formed under the condition in which the deposition gas is diluted with hydrogen by setting the flow rate of hydrogen 10 to 2000 times, preferably 10 to 200 times that of the deposition gas containing silicon. Alternatively, when the deposition gas containing germanium is used instead of the deposition gas containing silicon, a microcrystalline germanium film can be formed. Further, when the deposition gas containing silicon and the deposition gas containing germanium are used, a microcrystalline silicon germanium film can be formed. The deposition temperature in that case is preferably 150° C. to 300° C., more preferably 150° C. to 280° C. The pressure in the reaction chamber and a distance between an upper electrode and a lower electrode may be set so that plasma can be generated.

A rare gas such as helium, argon, neon, krypton, or xenon may be used as a source gas for the semiconductor film 107, so that the deposition rate of the semiconductor film 107 can be increased. Moreover, the increased deposition rate decreases the amount of impurities entering the semiconductor film 107, so that the crystallinity of the semiconductor film 107 can be improved.

When the semiconductor film 107 is formed, glow discharge plasma can be generated in a manner similar to that of the gate insulating film 105.

Note that before the semiconductor film 107 is formed, a deposition gas containing a semiconductor material is introduced into the reaction chamber while a gas in the reaction chamber of the CVD apparatus is removed so that impurity elements in the reaction chamber are removed, in which case the amount of the impurity elements in the semiconductor film 107 can be reduced. Further, before the semiconductor film 107 is formed, plasma may be generated in an atmosphere containing fluorine such as a fluorine atmosphere, a nitrogen fluoride atmosphere, or a silane fluoride atmosphere and the gate insulating film 105 may be exposed to the fluorine plasma.

When the gate insulating film 105 is formed using a silicon nitride film, at an early stage of deposition of the semiconductor film 107, an amorphous semiconductor is easily formed and the crystallinity of the semiconductor film 107 is low. Therefore, the semiconductor film 107 is preferably formed under a condition that the dilution rate of the deposition gas containing a semiconductor material is high or under a low temperature condition that the deposition temperature is 150° C. to 250° C. Typically, the high dilution rate condition that the flow rate of hydrogen is 200 to 2000 times, preferably 250 to 400 times that of the deposition gas containing a semiconductor material is preferable. When the high dilution rate condition or the low temperature condition is employed, initial nucleation density is increased, an amorphous semiconductor is not easily formed over the gate insulating film 105, and the crystallinity of the semiconductor film 107 is improved. Further, when the surface of the gate insulating film 105 formed using the silicon nitride film is subjected to oxidation treatment, the adhesion with the semiconductor film 107 can be improved. As oxidation treatment, exposure to an oxidizing gas, plasma treatment in an oxidizing gas, or the like can be used.

The impurity semiconductor film 111 is formed by glow discharge plasma with the use of a mixture of hydrogen, phosphine (diluted with hydrogen or silane), and a deposition gas containing a semiconductor material in the reaction chamber of the plasma CVD apparatus. The deposition gas containing a semiconductor material is diluted with hydrogen, and an amorphous silicon film to which phosphorus is added, a microcrystalline silicon film to which phosphorus is added, an amorphous germanium film to which phosphorus is added, a microcrystalline germanium film to which phosphorus is added, or a film of a mixture thereof is formed. In the case where a p-channel thin film transistor is formed, the impurity semiconductor film 111 may be formed by glow discharge plasma using diborane instead of phosphine.

Next, a resist mask is formed over the impurity semiconductor film 111 by a photolithography method.

Next, the semiconductor film 107 and the impurity semiconductor film 111 are etched using the resist mask. By this step, the semiconductor film 107 and the impurity semiconductor film 111 are divided into each element to form a semiconductor film 113 and an impurity semiconductor film 117. After that, the resist mask is removed (see FIG. 3B).

Figure 3C:
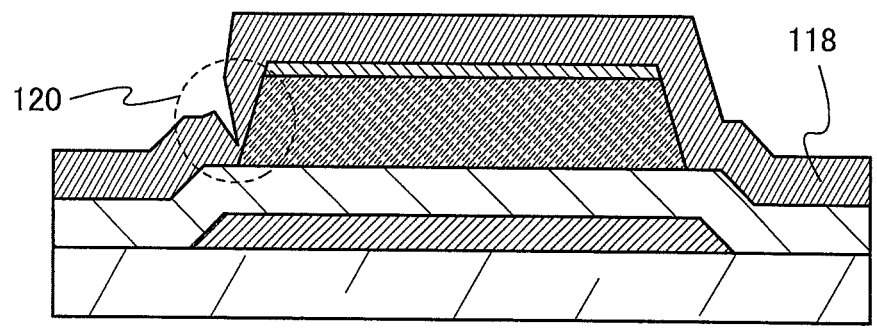

Next, a conductive film 118 is formed over the impurity semiconductor film 117 (see FIG. 3C). The conductive film 118 is formed by a sputtering method. In the case where a portion in which the conductive film 118 is not sufficiently deposited, such as a region 120, is formed due to surface unevenness of the semiconductor film 113, a material of a low resistance conductive film to be formed later is diffused into the semiconductor film, causing an increase in off-state current of a transistor.

A metal element included in the conductive film 118 is one or more of titanium, nickel, zinc, gallium, zirconium, niobium, molybdenum, indium, tin, and tungsten.

Next, a surface of the conductive film 118 is oxidized, and fluorinated or chlorinated. In this embodiment, surface treatment is performed with the use of plasma generated from a mixed gas of an oxidizing gas and a halogen-based gas, so that part of or the whole of the surface of the conductive film 118 is oxidized, and fluorinated or chlorinated.

When the surface of the conductive film 118 which is oxidized, and fluorinated or chlorinated is exposed to an atmosphere containing water, the portion of the conductive film 118 which is oxidized, and fluorinated or chlorinated is fluidized, part of fluorine or chlorine is removed, and the fluidized part of the conductive film 118 is solidified; thus, a conductive film 119a which is an unreacted part and a conductive film 119b which is a reacted part are formed. The conductive film 119b is a metal oxide.

Figure 4A:
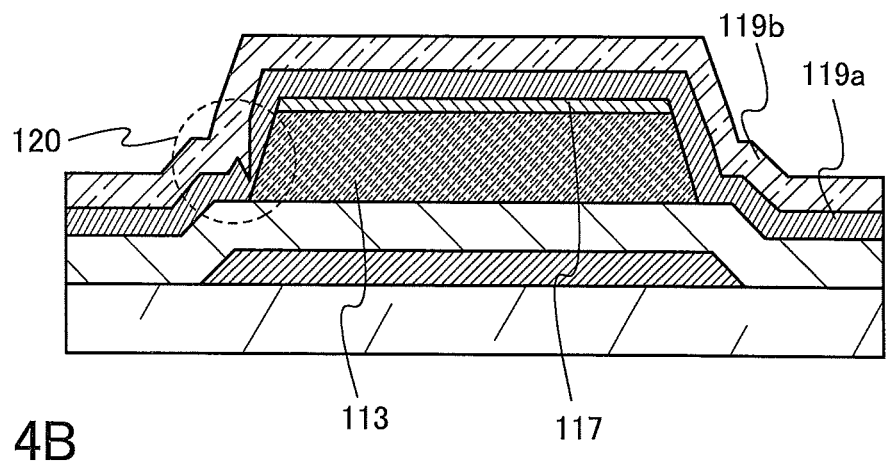
FIGS. 4A and 4B are cross-sectional views illustrating a method for manufacturing a semiconductor device of one embodiment of the present invention.

As described above, by reflow of part of or the whole of the conductive film 118, the conductive film 119b can be embedded in the region 120 in which the conductive film 118 is not sufficiently deposited (see FIG. 4A).

Figure 4B:
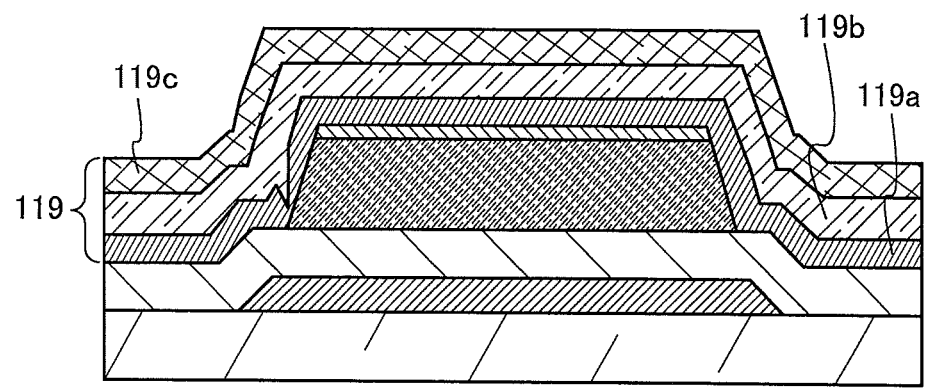

Next, a conductive film 119c is formed using a film of only a copper, aluminum, or silver, an alloy film which includes copper, aluminum, or silver as its main component over the conductive film 119b (see FIG. 4B).

Next, a resist mask is formed by a photolithography method, and the conductive film 119 is etched using the resist mask to form the wirings 123 serving as a source electrode and a drain electrode. The wirings 123 each include the conductive film 123a, the metal oxide film 123b, and the low resistance conductive film 123c. A dry etching method or a wet etching method can be used for the etching of the conductive film 119. Note that one of the wirings 123 serves not only as a source or drain electrode but also as a signal line. However, without limitation thereto, a signal line may be provided separately from a source electrode and a drain electrode.

Next, the impurity semiconductor film 117 and part of the semiconductor film 113 are etched, so that a pair of impurity semiconductor films 125 serving as a source region and a drain region is formed. Further, the semiconductor film 129 whose exposed portion of a surface (channel region) is etched to have a recessed shape is formed.

Since a dry etching method is used in the etching here, ends of the wirings 123 are aligned with ends of the impurity semiconductor films 125. When the conductive film 119 is subjected to wet etching and the impurity semiconductor film 117 is subjected to dry etching, the ends of the wirings 123 and the ends of the impurity semiconductor films 125 are not aligned with each other. In a cross section in such a case, the ends of the wirings 123 are positioned on the inner side than the ends of the impurity semiconductor films 125. That is, a distance between the wirings 123 is larger than that of the impurity semiconductor films 125.

Next, surface treatment may be performed. A condition of the surface treatment is set so that the semiconductor film 129 is not damaged and the semiconductor film 129 is hardly etched. For example, dry etching is performed using typically chlorine, carbon tetrachloride, nitrogen, or the like. There is no particular limitation on a dry etching method, and an inductively coupled plasma (ICP) method, a capacitively coupled plasma (CCP) method, an electron cyclotron resonance (ECR) method, a reactive ion etching (RIE) method, or the like can be used.

Next, plasma treatment such as water plasma treatment, oxygen plasma treatment, ammonia plasma treatment, or nitrogen plasma treatment may be performed on the surface of the semiconductor film 129.

Water plasma treatment can be performed in such a manner that a gas containing water as its main component, typified by water vapor ($H_2O$ vapor) is introduced into a reaction space and plasma is generated. After that, the resist mask is removed (see FIG. 5A). Note that the resist mask may be removed before the surface treatment of the impurity semiconductor films 125 and the semiconductor film 129.

After the semiconductor film 129 is formed, the surface treatment is performed under a condition in which the semiconductor film 129 is not damaged, so that an impurity such as a residue existing over the exposed semiconductor film 129 can be removed. Further, by the plasma treatment, insulation between the source region and the drain region can be ensured, and thus, in the thin film transistor to be completed, off-state current can be reduced and variation in electric characteristics can be reduced.

Through the above-described process, a single-gate thin film transistor can be manufactured.

Next, the insulating film 131 is formed. The insulating film 131 can be formed in a manner similar to that of the gate insulating film 105 (see FIG. 5B).

Through the above process, as illustrated in FIG. 1A, the thin film transistor having large on-state current, high field-effect mobility, and small off-state current, can be manufactured with a high yield.

(Embodiment 5)

In this embodiment, a method for manufacturing a thin film transistor, which is different from the method described in Embodiment 4, will be described with reference to FIGS. 3A to 3C, FIGS. 4A and 4B, and FIGS. 5A and 5B.

In this embodiment, as the oxidizing gas, remaining oxygen in the chamber where plasma is generated is used.

First, oxygen cleaning is performed in the chamber where plasma is generated. The oxygen cleaning is performed once or more and 25 times or less under the following conditions, for example: the oxygen gas flow rate is greater than or equal to 100 sccm and less than or equal to 500 sccm; the ICP power is greater than or equal to 1000 W and less than or equal to 6000 W; the RF bias power is greater than or equal to 0 W and less than or equal to 300 W; the pressure is higher than or equal to 0.4 Pa and lower than or equal to 5 Pa; and the treatment time is longer than or equal to 10 seconds and shorter than or equal to 600 seconds.

Next, as in Embodiment 4, the semiconductor film 113, the impurity semiconductor film 117, and the conductive film 118 are formed (see FIG. 3C). The conductive film 118 serves as a diffusion prevention film.

Next, the surface of the conductive film 118 is oxidized, and fluorinated or chlorinated. In this embodiment, surface treatment is performed with the use of plasma generated from a mixed gas of a halogen-based gas and oxygen which remains in the chamber where plasma is generated, so that part of or the whole of the conductive film 118 is oxidized, and fluorinated or chlorinated, and an oxide can be formed.

When the surface of the conductive film 118 is exposed to an atmosphere containing water, the oxide of the conductive film 118 is fluidized, part of fluorine or chlorine is removed, and the fluidized part of the conductive film 118 is solidified. The conductive film 119a which is an unreacted part in the plasma treatment described above and the conductive film 119b are formed from the fluidized conductive film 118. The conductive film 119b is a metal oxide which is formed in such a manner that the oxide of the conductive film 118 is fluidized and solidified.

By reflow of part of or the whole of the conductive film 118, the conductive film 119b can be embedded in the region 120 in which the conductive film 118 is not sufficiently deposited (see FIG. 4A).

In this embodiment, oxygen cleaning is performed in advance in the chamber where plasma is generated, so that oxygen which remains in the chamber where the plasma is generated is supplied. Accordingly, oxidation of the conductive film 118 is possible without additional introduction of an oxidizing gas.

Figure 5A:
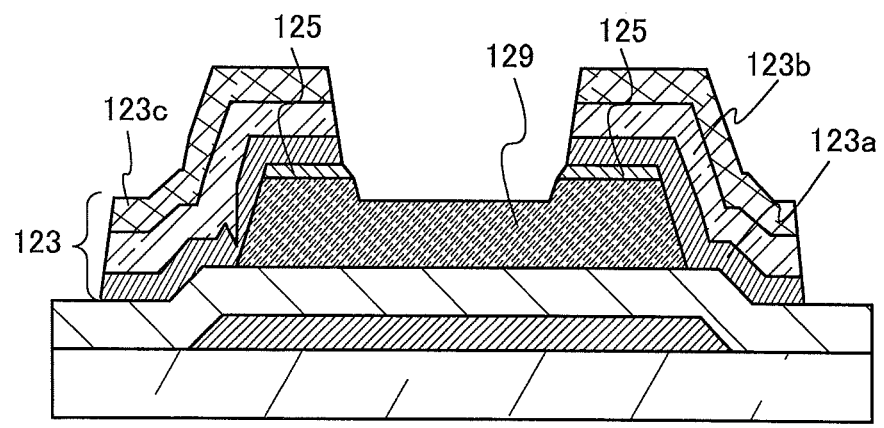
FIGS. 5A and 5B are cross-sectional views illustrating a method for manufacturing a semiconductor device of one embodiment of the present invention.

Next, as in Embodiment 4, the wirings 123, the impurity semiconductor films 125, and the semiconductor film 129 are formed (see FIG. 5A).

Figure 5B:
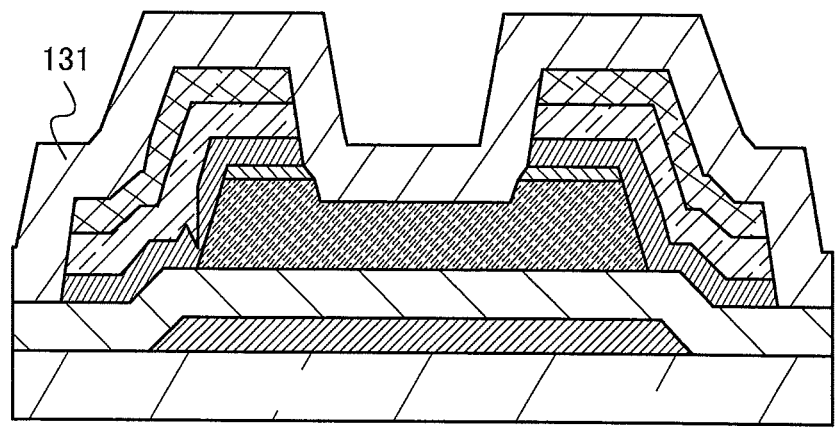

Note that the insulating film 131 may be formed over the semiconductor film 129 and the wirings 123 (see FIG. 5B).

Through the above process, as illustrated in FIG. 1A, the thin film transistor having large on-state current, high field-effect mobility, and small off-state current, can be manufactured with a high yield.

(Embodiment 6)

In this embodiment, a method for manufacturing the thin film transistor described in Embodiment 3 will be described with reference to FIGS. 6A to 6C and FIGS. 8A and 8B.

Figure 6A:
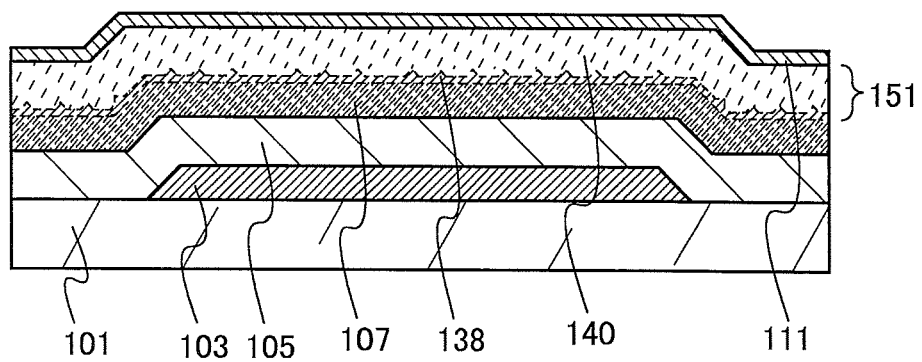
FIGS. 6A to 6C are cross-sectional views illustrating a method for manufacturing a semiconductor device of one embodiment of the present invention.
Figure 6B:
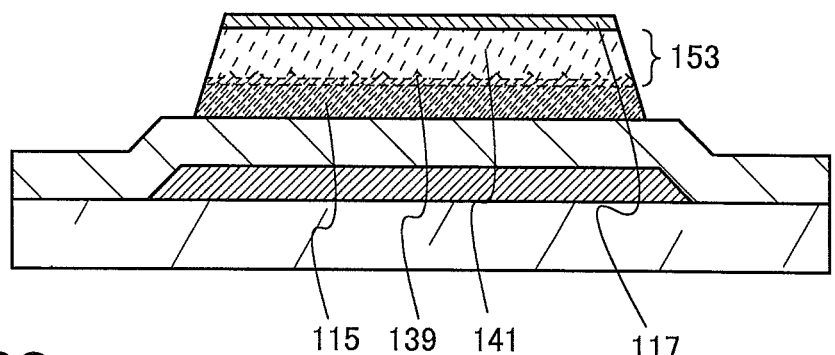

As in Embodiment 4, as illustrated in FIG. 6A, the gate electrode 103 is formed over the substrate 101. Next, the gate insulating film 105 which covers the gate electrode 103 is formed, and the semiconductor film 107 is formed over the gate insulating film 105. Next, a semiconductor film 151 containing nitrogen is formed over the semiconductor film 107. Next, the impurity semiconductor film 111 is formed over the semiconductor film 151 containing nitrogen. The semiconductor film 107 and the impurity semiconductor film 111 can be formed in a manner similar to that in Embodiment 4.

The semiconductor film 151 containing nitrogen includes a microcrystalline semiconductor film 138 containing nitrogen and an amorphous semiconductor film 140 containing nitrogen. The microcrystalline semiconductor film 138 containing nitrogen and the amorphous semiconductor film 140 containing nitrogen can be formed under a condition that crystal growth is partly conducted (the crystal growth is partly suppressed) with the use of the semiconductor film 107 as a seed crystal.

The semiconductor film 151 containing nitrogen is formed in a reaction chamber of the plasma CVD apparatus by glow discharge plasma with the use of a mixture of a deposition gas containing a semiconductor material, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the semiconductor film 107.

In this case, a flow ratio of the deposition gas containing a semiconductor material to hydrogen is the same as that for forming the semiconductor film 107, and a gas containing nitrogen is used as a source gas, whereby crystal growth can be suppressed as compared to the deposition condition of the semiconductor film 107. Specifically, at an early stage of deposition of the semiconductor film 151 containing nitrogen, the gas containing nitrogen included in the source gas partly suppresses the crystal growth, so that a conical or pyramidal microcrystalline semiconductor containing nitrogen grows and an amorphous semiconductor containing nitrogen is formed. Further, at a middle stage or a later stage of the deposition, crystal growth in the conical or pyramidal microcrystalline semiconductor containing nitrogen stops, and only the amorphous semiconductor containing nitrogen is deposited. Accordingly, in the semiconductor film 151 containing nitrogen, the microcrystalline semiconductor film 138 containing nitrogen, and the amorphous semiconductor film 140 containing nitrogen which is formed using a well-ordered semiconductor film having fewer defects and a steep tail of a level at a band edge in the valence edge, can be formed.

Here, a typical example of a condition for forming the semiconductor film 151 containing nitrogen is as follows: the flow rate of hydrogen is 10 to 2000 times, preferably 10 to 200 times that of the deposition gas containing a semiconductor material. Note that in a typical example of a condition for forming a normal amorphous semiconductor film, the flow rate of hydrogen is 0 to 5 times that of the deposition gas containing a semiconductor material.

A rare gas such as helium, neon, argon, xenon, or krypton is introduced into the source gas of the semiconductor film 151 containing nitrogen, whereby the deposition rate can be increased.

The thickness of the semiconductor film 151 containing nitrogen is preferably 50 nm to 350 nm, more preferably 120 nm to 250 nm.

Next, a resist mask is formed over the impurity semiconductor film 111 by a photolithography method as in Embodiment 4.

Next, the semiconductor film 107, the semiconductor film 151 containing nitrogen, and the impurity semiconductor film 111 are etched using the resist mask. By this step, the semiconductor film 107, the semiconductor film 151 containing nitrogen, and the impurity semiconductor film 111 are divided into each element to form the semiconductor film 115, the semiconductor film 153 containing nitrogen, and the impurity semiconductor film 117. Note that the semiconductor film 153 containing nitrogen includes the microcrystalline semiconductor film 139 containing nitrogen and an amorphous semiconductor film 141 containing nitrogen. After that, the resist mask is removed (see FIG. 6B).

Next, as in Embodiment 4, the conductive film 119 is formed over the impurity semiconductor film 117. The conductive film 119 includes the conductive film 119a, the conductive film 119b which is a conductive metal oxide, and the conductive film 119c formed using a wiring material with low resistance. The conductive film 119a and the conductive film 119b are formed in such a manner that part of or the whole of the surface of the conductive film is subjected to treatment using plasma generated from a mixed gas of an oxidizing gas and a halogen-based gas to be oxidized, and fluorinated or chlorinated, the oxidized, and fluorinated or chlorinated conductive film is exposed to an atmosphere containing water, the oxidized, and fluorinated or chlorinated part is fluidized, part of fluorine or chlorine is removed from the film, and the fluidized part is solidified (see FIG. 6C).

By reflow of part of or the whole of the conductive film, the conductive film 119b can be embedded in the region 120 in which the conductive film is not sufficiently deposited.

Figure 6C:
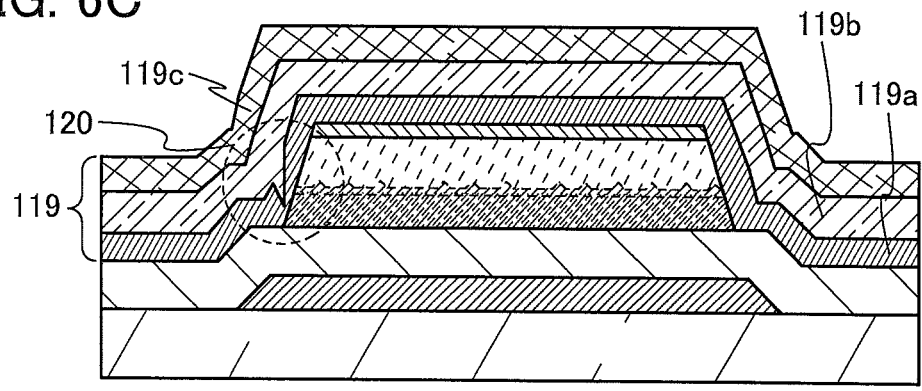

Next, the conductive film 119c is formed using a wiring material with low resistance over the conductive film 119b (see FIG. 6C).

Next, as in Embodiment 4, a resist mask is formed by a photolithography method, and the conductive film 119 is etched using the resist mask to form the wirings 123 serving as a source electrode and a drain electrode. The wirings 123 each include the conductive film 123a, the metal oxide film 123b, and the low resistance conductive film 123c. Next, part of the impurity semiconductor film 117 is etched to form a pair of the impurity semiconductor films 125 serving as a source region and a drain region. Further, the amorphous semiconductor film 147 containing nitrogen, in which an exposed portion is etched to have a recessed shape, is formed (see FIG. 8A).

Note that in addition to the impurity semiconductor film 117 and the amorphous semiconductor film 147 containing nitrogen, part of the semiconductor film 115 may be etched. In this case, a microcrystalline semiconductor film in which an exposed region is etched to have a recessed shape is formed.

Next, dry etching as surface treatment and plasma treatment may be performed as in Embodiment 4.

Through the above-described process, a single-gate thin film transistor can be manufactured.

Figure 8A:
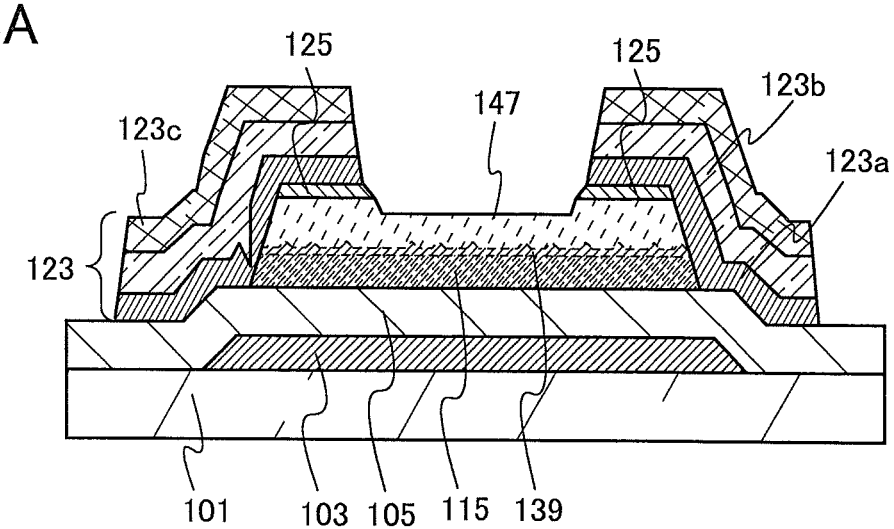
FIGS. 8A and 8B are cross-sectional views illustrating a method for manufacturing a semiconductor device of one embodiment of the present invention.
Figure 8B:
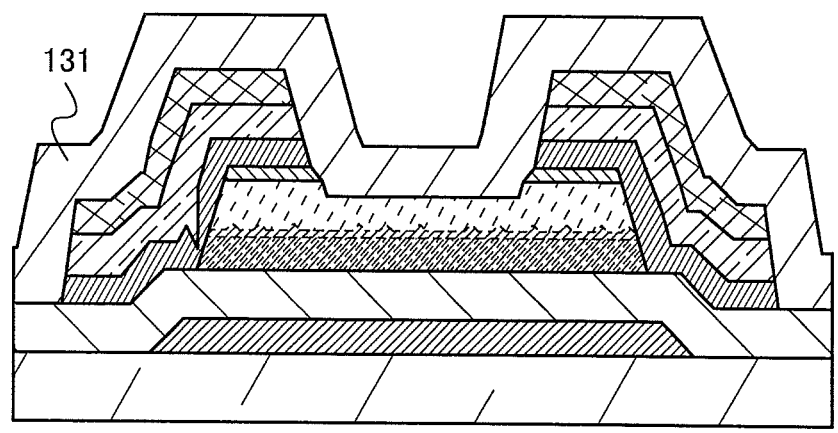

Next, the insulating film 131 is formed (see FIG. 8B). The insulating film 131 can be formed in a manner similar to that of the gate insulating film 105.

Through the above steps, as illustrated in FIG. 2B, the thin film transistor having large on-state current, high field-effect mobility, small low off-state current, can be manufactured with a high yield.

(Embodiment 7)

Thin film transistors are manufactured, and a semiconductor device having a display function (also referred to as a display device) can be manufactured using the thin film transistors in a pixel portion and also in a driver circuit. Further, part or whole of a driver circuit including a thin film transistor can be formed over the same substrate as a pixel portion, whereby a system-on-panel can be obtained.

The display device includes a display element. As a display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. Further, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is provided, a state after a conductive film to be a pixel electrode is formed and before the pixel electrode is formed by etching the conductive film, or any other states.

Note that the display device in this specification includes a light source (including a lighting device). Further, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

(Embodiment 8)

A semiconductor device disclosed in this specification can be applied to electronic paper. Electronic paper can be used for electronic appliances of a variety of fields as long as they can display data. For example, electronic paper can be applied to an electronic book (e-book) reader, a poster, a digital signage, a public information display (PID), an advertisement in a vehicle such as a train, displays of various cards such as a credit card, and the like. An example of an electronic appliance is illustrated in FIG. 9.

Figure 9:
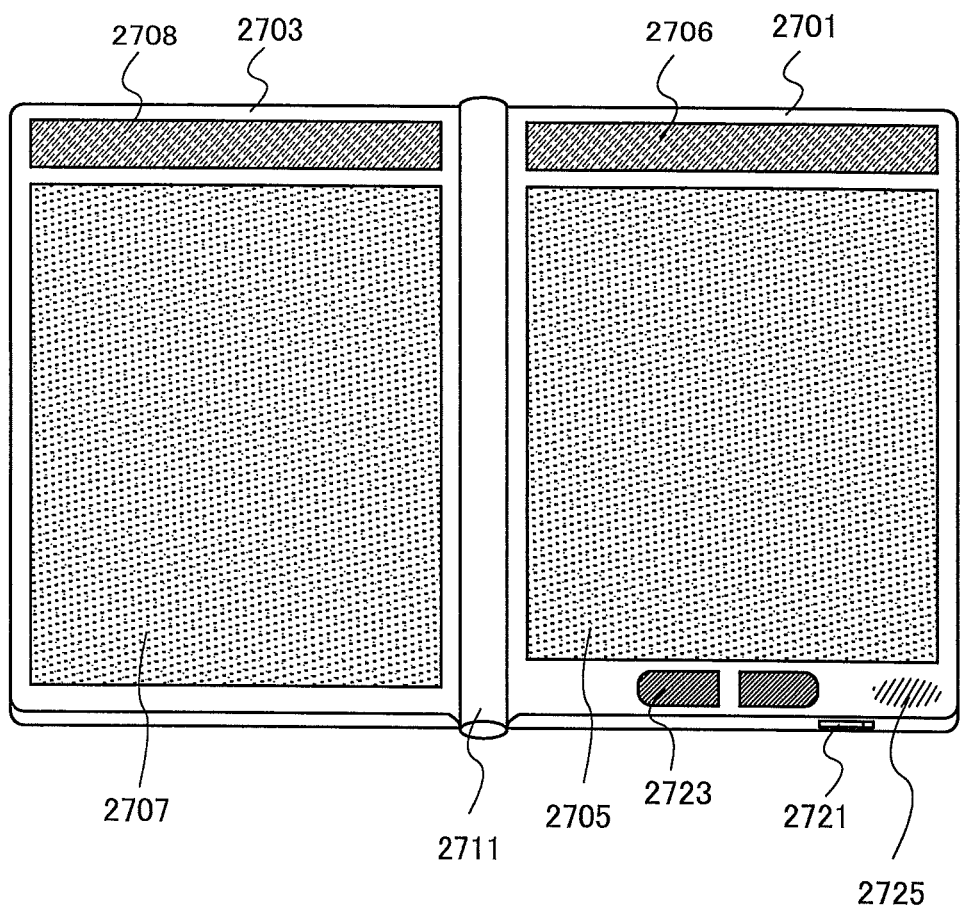
FIG. 9 is a perspective view illustrating an example of an e-book reader.

FIG. 9 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. According to the structure where different images are displayed in different display portions, for example, text can be displayed on the right display portion (the display portion 2705 in FIG. 9) and images can be displayed on the left display portion (the display portion 2707 in FIG. 9).

FIG. 9 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Further, an external connection terminal (an earphone terminal, a USB terminal, an AC adapter, a terminal that can be connected to various cables such as a USB cable, or the like), a recording medium insertion portion, or the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.
(Embodiment 9)

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a portable game machine, a personal digital assistant, a mobile phone device, an audio reproducing device, and a large-sized game machine such as a pachinko machine.

Figure 10A:
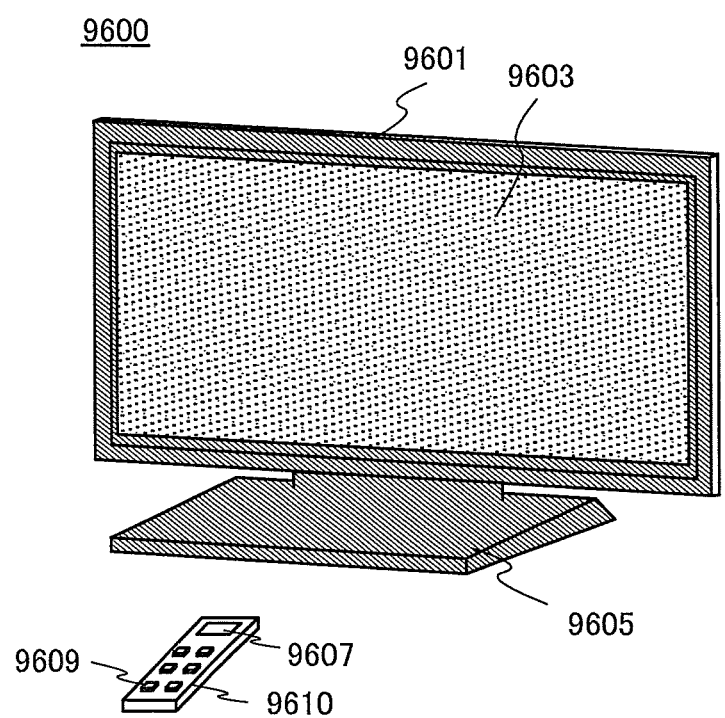
FIGS. 10A and 10B are perspective views illustrating a television device and a digital photo frame, respectively.

FIG. 10A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 10B:
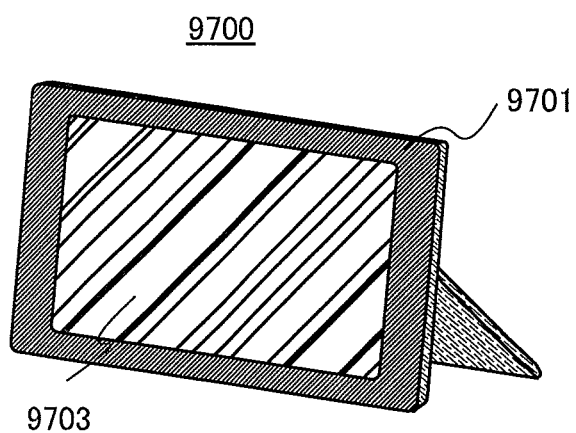

FIG. 10B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 11:
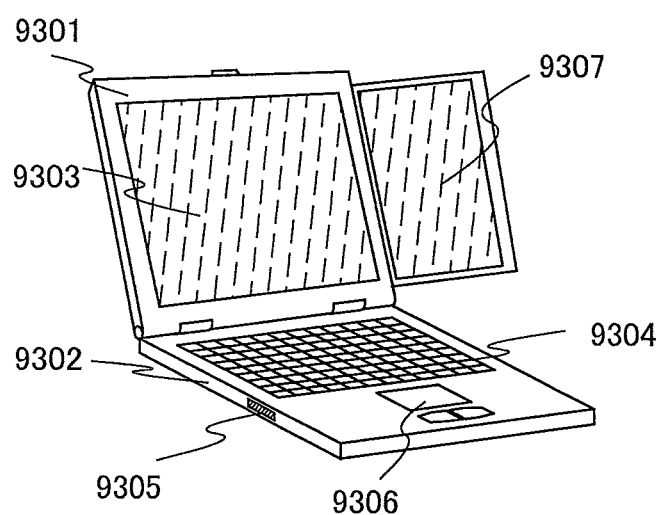
FIG. 11 is a perspective view illustrating an example of a portable computer.

FIG. 11 is a perspective view illustrating an example of a portable computer.

In the portable computer illustrated in FIG. 11, a top housing 9301 having a display portion 9303 and a bottom housing 9302 having a keyboard 9304 can overlap with each other by closing a hinge unit which connects the top housing 9301 and the bottom housing 9302. The portable computer illustrated in FIG. 11 is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. Further, when the display portion 9303 is a touch input panel, data input can be performed by touching part of the display portion 9303. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch screen, the user can input data by touching part of the display portion 9307 which can be kept in the top housing 9301.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the portable computer illustrated in FIG. 11 can be provided with a receiver and the like to receive television broadcasting to display images on the display portion. The user can watch television broadcasting when the whole screen of the display portion 9307 is slid so as to be drawn from the top housing 9301 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

EXAMPLE 1

In this example, a cross-sectional shape of a semiconductor device which is one embodiment of the present invention will be described.

The cross-sectional shape of the semiconductor device of this example was evaluated by scanning transmission electron microscopy (STEM). Evaluation by STEM was performed using an Ultra-thin Film Evaluation System HD-2300 manufactured by Hitachi High-Technologies Corporation.

Samples were prepared under two different conditions. Their details will be described below.

A glass substrate was used as the substrate.

A conductive film was formed over the glass substrate by a sputtering method. In the conductive film, a 50-nm-thick titanium film was formed as a first layer, a 100-nm-thick aluminum film was formed as a second layer, and a 50-nm-thick titanium film was formed as a third layer.

Next, the conductive film was etched into a desired shape using a resist mask formed by a photolithography method to form a gate electrode.

Next, a gate insulating film, a microcrystalline semiconductor film, an amorphous semiconductor film, and an impurity semiconductor film were successively formed by a CVD method. A 240-nm-thick silicon nitride oxide film was formed as the gate insulating film. A 30-nm-thick microcrystalline silicon film was formed as the microcrystalline semiconductor film. A 175-nm-thick amorphous silicon film containing nitrogen was formed as the amorphous semiconductor film. A 50-nm-thick amorphous silicon film containing phosphorus was formed as the impurity semiconductor film.

Next, the impurity semiconductor film, the amorphous semiconductor film, and the microcrystalline semiconductor film were etched into an island shape using a resist mask formed by a photolithography method.

Next, a conductive film to be a wiring was formed. Here, a conductive film having a three-layer structure was formed.

As the first conductive film of the wiring, a titanium film was formed by a sputtering method. The thickness of the titanium film was 50 nm.

Next, plasma treatment was performed on a surface of the titanium film The plasma treatment was performed by an ICP etching method; the flow rate of a carbon tetrafluoride gas was 100 sccm, the ICP power was 1000 W, the RF bias power was 50 W, the pressure was 0.67 Pa, and the treatment time was 60 seconds.

Note that as an oxidizing gas used for the above plasma treatment, oxygen remaining in a chamber where plasma was generated was used.

Oxygen cleaning was performed to make oxygen remain in the chamber before performing the above plasma treatment. As the oxygen cleaning, a dummy substrate was introduced and treatment was repeated 10 times under the following conditions: the oxygen gas flow rate was 200 sccm, the ICP power was 4000 W, the RF bias power was 50 W, the pressure was 0.67 Pa, and the treatment time was 120 seconds.

Next, the titanium film whose surface was subjected to plasma treatment was exposed to an atmosphere containing water to form a titanium oxide film The atmosphere containing water was prepared using a dry etching apparatus. In this example, an ICP etching method was performed in the atmosphere containing water. Specifically, the water gas flow rate was 300 sccm, the ICP power was 1800 W, the RF bias power was 0 W, the pressure was 66.5 Pa, and the treatment time was 180 seconds.

Next, as the second conductive film of the wiring, a 200-nm-thick aluminum film was formed by a sputtering method.

Next, as the third conductive film of the wiring, a 50-nm-thick titanium film was formed by a sputtering method.

Next, in order to divide the wiring and the impurity semiconductor film into parts, the wiring, the impurity semiconductor film, and part of the amorphous semiconductor film were etched using a resist mask formed by a photolithography method.

Conditions of samples manufactured in this example are shown in Table 1.

TABLE 1

|  | Sample 1 | Sample 2 |
| --- | --- | --- |
| ICP etching method | — | ○ |
| Plasma treatment with carbon tetrafluoride gas |  |  |
| $H_2O$ plasma | — | ○ |

Cross-sectional shapes of the semiconductor devices manufactured in this example will be described with reference to FIGS. 12A and 12B.

Figure 12A:
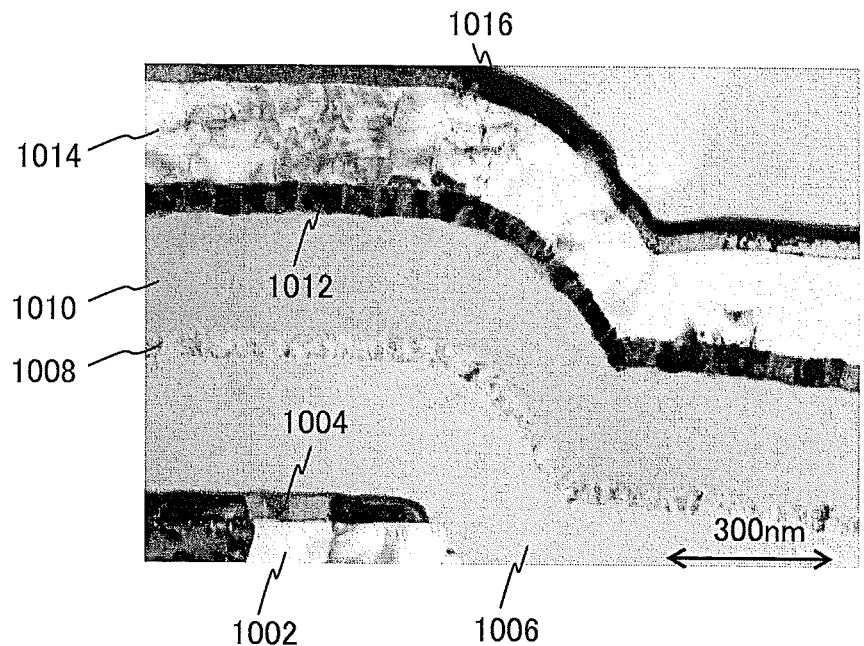
FIGS. 12A and 12B each show a cross-sectional shape of a semiconductor device of one example of the present invention.
Figure 12B:
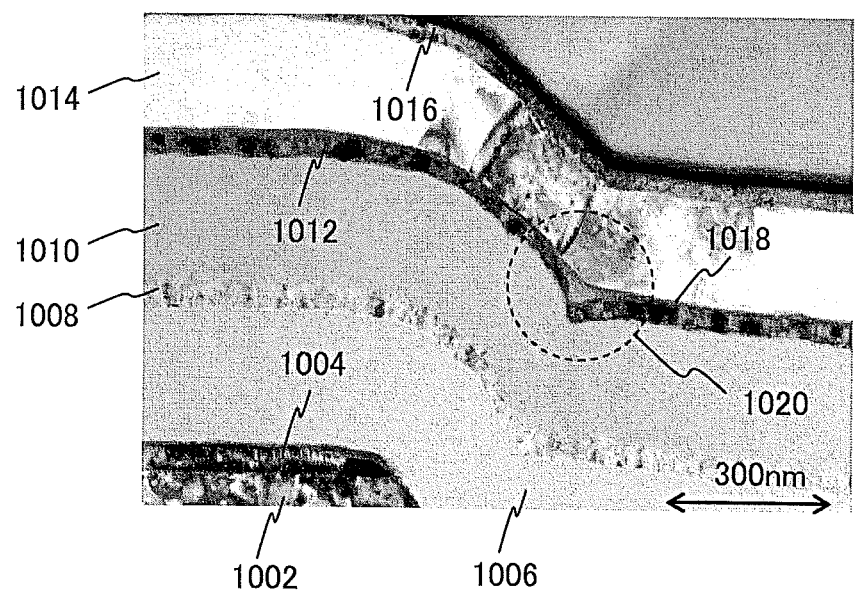

FIGS. 12A and 12B are STEM images in which cross sections of Sample 1 and Sample 2 are enlarged 100,000 times.

Here, a gate electrode 1002 is an aluminum film; a gate electrode 1004 is a titanium film; a gate insulating film 1006 is a silicon nitride oxide film; a microcrystalline semiconductor film 1008 is a microcrystalline silicon film; an amorphous semiconductor film 1010 is an amorphous silicon film; a first conductive film 1012 which is part of a wiring is a titanium film; a second conductive film 1014 which is part of the wiring is an aluminum film; a third conductive film 1016 which is part of the wiring is a titanium film; and a metal oxide film 1018 is a titanium oxide film.

Sample 1 was not subjected to plasma treatment after the first conductive film 1012 was formed; therefore, the metal oxide film 1018 does not exist at an interface between the first conductive film 1012 and the second conductive film 1014.

In Sample 2, the metal oxide film 1018 exists on the first conductive film 1012. It is found that the metal oxide film 1018 was deposited in a region 1020 where the first conductive film 1012 was thin.

As described above, a uniform diffusion prevention film can be formed at a step portion.

This application is based on Japanese Patent Application serial no. 2010-151890 filed with Japan Patent Office on Jul. 2, 2010, the entire contents of which are hereby incorporated by reference.

What is claimed is:

1. A semiconductor device comprising:
    a semiconductor film comprising an impurity region to which an impurity imparting one conductive type is added; and
    a wiring over the semiconductor film, wherein the wiring comprises:
        a diffusion prevention film comprising a conductive metal oxide; and
        a conductive film over the diffusion prevention film,
    wherein the diffusion prevention film and the impurity region are in contact with each other, and
    wherein the conductive metal oxide comprises fluorine or chlorine.

2. The semiconductor device according to claim 1, wherein the diffusion prevention film comprises one or more of titanium, nickel, zinc, gallium, zirconium, niobium, molybdenum, indium, tin, and tungsten.

3. The semiconductor device according to claim 1, wherein the conductive metal oxide comprises fluorine or chlorine at a concentration of $1\times10^{19}$ atoms/cm$^3$ or higher.

4. The semiconductor device according to claim 1, wherein the conductive metal oxide is an oxide of a metal element included in the diffusion prevention film.

5. The semiconductor device according to claim 1, wherein the conductive metal oxide is titanium oxide.

6. The semiconductor device according to claim 1, wherein the conductive film comprises any one of copper, aluminum, and silver.

7. A semiconductor device comprising:
a semiconductor layer comprising an impurity imparting one conductive type to the semiconductor layer;
a first conductive layer over the semiconductor layer, wherein the first conductive layer comprises a groove;
an oxide layer on the first conductive layer, wherein the oxide layer fills the groove; and
a second conductive layer over the oxide layer,
wherein the oxide layer comprises fluorine or chlorine.

8. The semiconductor device according to claim 7, wherein the first conductive layer comprises one or more of titanium, nickel, zinc, gallium, zirconium, niobium, molybdenum, indium, tin, and tungsten.

9. The semiconductor device according to claim 7, wherein the oxide layer comprises fluorine or chlorine at a concentration of $1\times10^{19}$ atoms/cm$^3$ or higher.

10. The semiconductor device according to claim 7, wherein the oxide layer comprises an oxide of a metal element included in the first conductive layer.

11. The semiconductor device according to claim 7, wherein the oxide layer comprises titanium oxide.

12. The semiconductor device according to claim 7, wherein the second conductive layer comprises any one of copper, aluminum, and silver.

13. A semiconductor device comprising:
a semiconductor layer;
a first conductive layer over the semiconductor layer, wherein the first conductive layer comprises a groove;
an oxide layer on the first conductive layer, wherein the oxide layer fills the groove; and
a second conductive layer over the oxide layer,
wherein the oxide layer comprises fluorine or chlorine.

14. The semiconductor device according to claim 13, wherein the first conductive layer comprises one or more of titanium, nickel, zinc, gallium, zirconium, niobium, molybdenum, indium, tin, and tungsten.

15. The semiconductor device according to claim 13, wherein the oxide layer comprises fluorine at a concentration of $1\times10^{19}$ atoms/cm$^3$ or higher.

16. The semiconductor device according to claim 13, wherein the oxide layer comprises an oxide of a metal element included in the first conductive layer.

17. The semiconductor device according to claim 13, wherein the oxide layer comprises titanium oxide.

18. The semiconductor device according to claim 13, wherein the second conductive layer comprises any one of copper, aluminum, and silver.

19. The semiconductor device according to claim 13, wherein the semiconductor layer comprises silicon or germanium.

* * * * *